(12) United States Patent
Biyani et al.

(10) Patent No.: US 6,775,180 B2
(45) Date of Patent: Aug. 10, 2004

(54) LOW POWER STATE RETENTION (75) Inventors: Manish Biyani, Chandler, AZ (US);
Lawrence T. Clark, Phoenix, AZ (US);
Shay P. Demmons, Chandler, AZ (US);
Franco Ricci, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/329,124

(22) Filed: Dec. 23, 2002

(65) Prior Publication Data

US 2004/0120182 A1 Jun. 24, 2004

(51) Int. Cl.[7] .............................................. G11C 11/00
(52) U.S. Cl. .................. 365/154; 365/156; 365/189.05
(58) Field of Search ................................. 365/154, 156, 365/189.05

(56) References Cited

U.S. PATENT DOCUMENTS 6,639,827 B2 * 10/2003 Clark et al. ................. 365/154

* cited by examiner

*Primary Examiner*—Huan Hoang
(74) *Attorney, Agent, or Firm*—Lanny L. Parker (57) ABSTRACT

An integrated circuit having a state retentive memory structure to store state values. A high performance section uses thin gate-oxide transistors and the state retentive memory structure uses thick gate-oxide transistors to capture and retain the state values when operating in a low power mode.

40 Claims, 6 Drawing Sheets

LOW POWER STATE RETENTION

Portable products may lower the operating voltage of electronic devices to conserve power and also use process scaling to reduce the area needed for memory arrays and logic blocks in an effort to lower the product costs. This combination of process scaling and low operating voltage potentials may result in high leakage currents and high standby power consumption. It is advantageous then, to limit power consumption by cutting off power to circuits when not in use since these scaled transistors may have large drain-to-source currents and gate leakage currents that may be appreciable during low voltage operation. It is also advantageous to retain the system state while reducing power. Thus, there is a continuing need for better ways to provide flexibility for operating a microprocessor that includes scaled electronic devices operating at reduced voltages while preserving low currents and retaining state values.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Embodiments of the present invention may be used in microcontrollers, general-purpose microprocessors, Digital Signal Processors (DSPs), Reduced Instruction-Set Computing (RISC), Complex Instruction-Set Computing (CISC), among other electronic components. The present invention has application in a variety of radio systems or hand-held portable devices. Thus, laptop computers that incorporate communication systems are intended to be included within the scope of the present invention, and the claimed subject matter may be incorporated in cellular radiotelephone, two-way radio pager communication systems, Personal Communication Systems (PCS), cameras, Personal Digital Assistants (PDAs), and automotive communication systems, among others. However, it should be understood that the scope of the present invention is not limited to these examples.

The principles of the present invention may be practiced in wireless devices that are connected in a Code Division Multiple Access (CDMA) cellular network such as IS-95, CDMA 2000, UMTS-WCDMA and distributed within an area for providing cell coverage for wireless communication. Additionally, the principles of the present invention may be practiced in Wireless Local Area Networks (WLAN), 802.11a–b, Orthogonal Frequency Division Multiplexing (OFDM), Ultra Wide Band (UWB), among others. The type of connection is not intended to limit the scope of the present invention.

Also, in the following description and claims, the terms "thin gate-oxide" and "thick gate-oxide," along with their derivatives, may be used. The use of these terms implies the integration of at least two transistors processed to intentionally have a different gate-oxide thickness, and therefore, having different characteristics. The adjectives "thin" and "thick" make a distinction between transistors and differentiate transistors having certain characteristics from other transistors. For instance, it is a generally accepted that the threshold voltage of the thick gate-oxide transistors is higher than thin gate-oxide transistors, which substantially lowers the drain-to-source ($I_{OFF}$) leakage current. The thicker gate oxide provides gate-oxide leakage currents having a value less than the source-to-drain leakage currents, typically by orders of magnitude. In other words, the gate leakage current ($J_{OX}$) of thick gate-oxide transistors is significantly less than the $J_{OX}$ of thin gate-oxide transistors. This allows the state retention circuitry that incorporates the thick gate-oxide transistors to provide a reduced gate leakage current and provide a lower power in a standby mode of operation. In the figures the thick gate-oxide transistors are indicated by a heavier line at the gate terminal.

Figure 1:
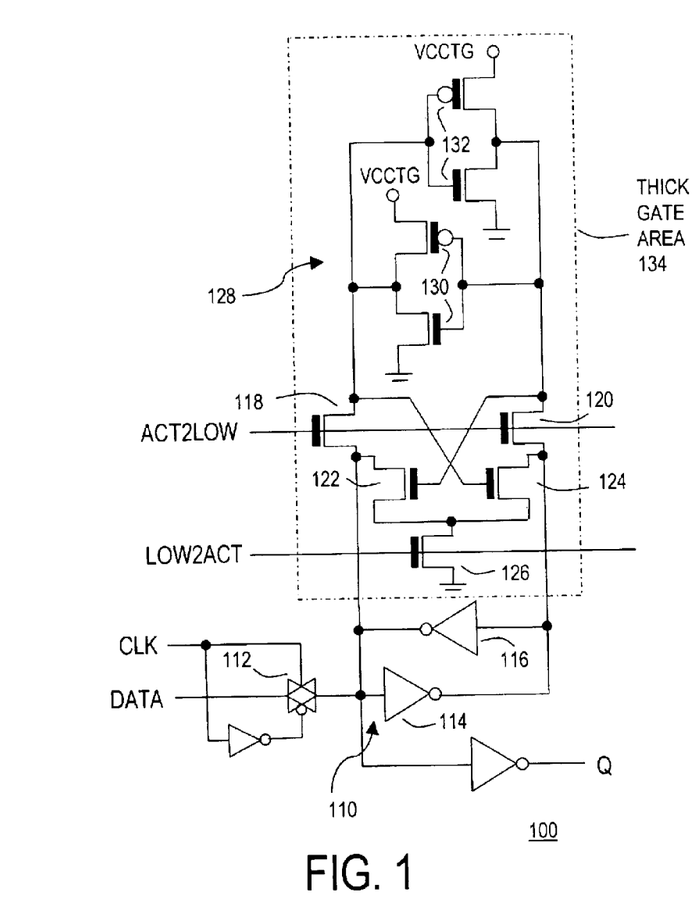
FIG. 1 is a schematic for a latch cell that incorporates a state retentive memory in accordance with the present invention.

FIG. 1 is a schematic for a latch cell 100 that includes a state retentive memory in accordance with the present invention. Latch cell 100 includes two latches, with latch 110 incorporated into a high performance section of an integrated circuit and associated latch 128 used as state retentive memory while power to latch 110 may be removed. Latch 110 includes inverters 114 and 116, with inverter 114 receiving data through a transmission gate 112 that is clocked with a signal CLK and inverter 116 providing the feedback signal that latches the received data. Data stored in latch 110 may be transferred through N-channel pass transistors 118 and 120 for storage by inverters 130 and 132 in latch 128.

Latch cell 100 further includes an N-channel transistor 122 having a gate connected to the input of inverter 130 and the output of inverter 132. N-channel transistor 124 has a gate connected to the input of inverter 132 and the output of inverter 130. The commonly connected sources of transistors 122 and 124 are coupled through a transistor 126 to a power conductor that receives a ground potential.

The transistors for transmission gate 112 and inverters 114 and 116 that are used in the high performance section may be processed to have a thin gate-oxide thickness when compared to the transistors in area 134. Area 134 includes the cross-coupled inverters 130 and 132, the pass transistors 118 and 120, and transistors 122, 124 and 126. Alternatively, transistor 126 may be processed to have a thin gate-oxide thickness. Although not shown in the figure, inverter 116 may be clocked, i.e., the inverter may include two N-channel transistors stacked with two P-channel transistors as is commonly known to those skilled in the art.

Latch 110 and the other logic in the high performance section receives an operating voltage potential of $V_{CC}$, while inverters 130 and 132 receive a separate operating voltage potential of $V_{CCTG}$. The P-channel MOS devices, whether located in the high performance section or the thick gate area 134, are in N-well regions that receive a bias with the voltage potential $V_{CCTG}$. Optionally, N-wells in the separate sections may be connected to $V_{CC}$ and $V_{CCTG}$, respectively.

In operation, latch 110 receives and stores data in the normal operating mode. The signals LOW2ACT and ACT2LOW are not asserted, minimizing the capacitive loading on latch 110 and allowing latch 110 to operate at high frequencies. Prior to entering a low power mode (also referred to as the ultra drowsy mode), the clocks may be stopped, i.e., the signal CLK has a zero logic state. When entering a low power mode, the signal ACT2LOW may be asserted and the state value stored in latch 110 may be transferred to latch 128. Note that the threshold voltages of latch 128 are higher than the threshold voltages of latch 110, making latch 110 "stronger" and dominant when writing a state value into latch 128. With the state value stored in latch 128, the signal ACT2LOW may be deasserted and the operating voltage potential $V_{CC}$ that powers logic in the high performance section may be switched to zero. The voltage potential of $V_{CCTG}$ is maintained during the low power mode to keep inverters 130 and 132 powered. With the operating voltage potential $V_{CC}$ switched to zero, the leakage currents of the thin gate-oxide transistors in the high performance section is negligible, thus providing lower power in a standby mode of operation. Alternatively, power may be removed from $V_{CC}$, allowing the voltage potential on the power conductor to move to $V_{SS}$ via leakage.

To leave the low power mode and return to an active operating mode, the signal LOW2ACT is asserted, followed by the operating voltage potential $V_{CC}$ being supplied to activate latch 110. The state value retained in latch 128 is written by transistors 122, 124 and 126 into latch 110 while powering up the high performance section. The signal LOW2ACT may then be deasserted when the operating voltage potential $V_{CC}$ becomes stable. Note that transistors 122, 124 and 126 may be thin gate if their gate leakage current contributions are tolerable.

Figure 2:
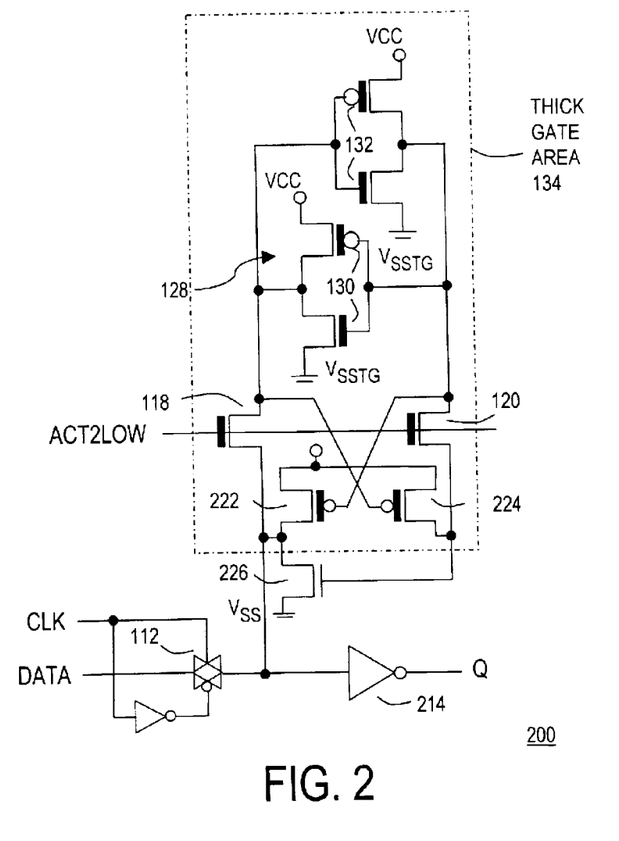
FIG. 2 is a schematic that illustrates another embodiment for a latch cell with a state retentive memory in accordance with the present invention.

FIG. 2 is a schematic diagram that illustrates another embodiment for a latch cell 200 with a state retentive memory in accordance with the present invention. In this embodiment, transistors 122, 124 and 126 have been replaced with transistors 222, 224 and 226. P-channel transistor 222 has a gate connected to the input of inverter 130 and the output of inverter 132. P-channel transistor 224 has a gate connected to the input of inverter 132 and the output of inverter 130. The source of transistor 222 is connected to the source of pass transistor 118 and further coupled through transistor 226 to a power conductor that receives a ground potential. The gate of transistor 226 is commonly connected to the source of transistor 224 and to the source of pass transistor 120.

In operation for the embodiment shown in FIG. 2, data is received through transmission gate 112 and stored on the input of inverter 214 in the normal mode of operation. The signal ACT2LOW is always asserted, allowing state storage on latch 128 in all modes of operation. Prior to entering the low power mode, the clocks may be stopped, i.e., the signal CLK has a zero logic state, and the signal ACT2LOW may be deasserted. The state value stored at the input of inverter 214 is thus isolated on latch 128. With the state value isolated on latch 128 and the signal ACT2LOW deasserted, the operating voltage potential $V_{SS}$ may be switched to a high value. Within thick gate area 134 the voltage potentials of $V_{CC}$ and $V_{SSTG}$ are maintained during the low power mode to keep inverters 130 and 132 powered. Note that either $V_{CC}$ or $V_{SS}$ in the thin gate region may have the power removed to collapse the rails and reduce leakage currents. Also note that the signal ACT2LOW may be a high voltage signal to allow faster circuit operation, the high voltage being determined by the maximum tolerated by the thick gate devices 118 and 120.

To leave the low power mode and return to an active operating mode, the operating voltage potential $V_{SS}$ is supplied to activate the logic in the high performance section such as, for example, inverter 214. The state value retained in latch 128 is written by transistors 222, 224 and 226 onto the node at the input of inverter 214 while powering up the high performance section. The signal ACT2LOW is not re-asserted until this state has been effectively written to avoid erroneous state being written to latch 128 during powerup.

Figure 3:
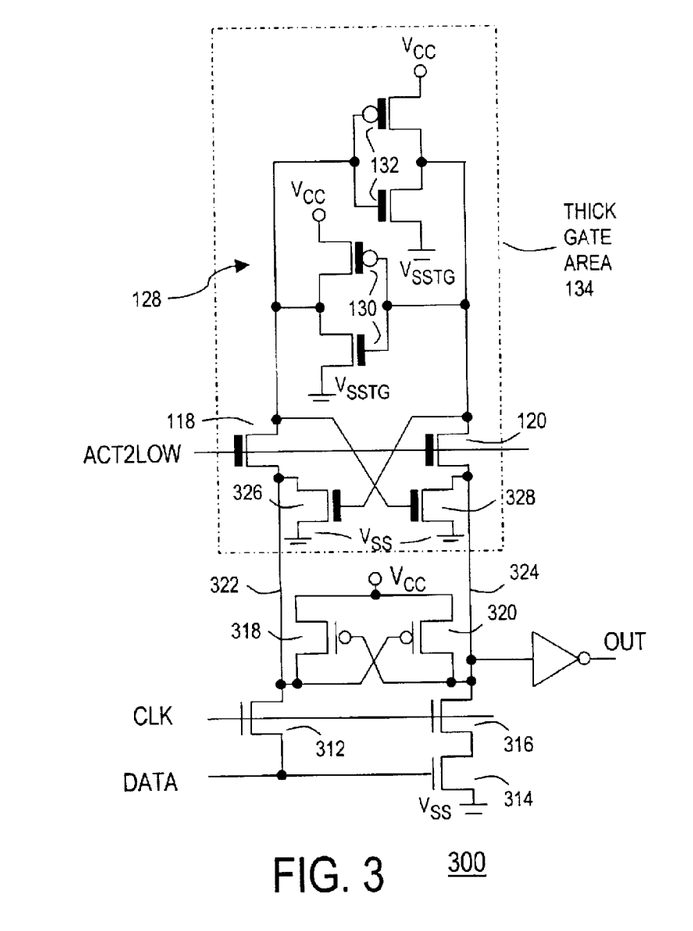
FIG. 3 is a schematic for a register file cell having a state retentive memory in accordance with the present invention.

FIG. 3 is a schematic for a register file cell 300 having a state retentive memory in accordance with the present invention. Register file cell 300 includes transistors 312, 314 and 316 incorporated into a high performance section of an integrated circuit. Data is provided to transistor 314, then transferred on the signal CLK by transistors 312 and 316 for storage on nodes 322 and 324, where cross-coupled P-channel transistors 318 and 320 aid in writing the data. For low frequency operation, transistors 318 and 320 may be considered optional. Data stored on nodes 322 and 324 may be transferred through N-channel pass transistors 118 and 120 as controlled by the signal ACT2LOW for storage by inverters 130 and 132 in latch 128. The signal ACT2LOW may be a high voltage signal that is asserted except during a power-up sequence as previously described. Register file cell 300 further includes an N-channel transistor 326 having a gate connected to the input of inverter 130 and to the output of inverter 132. N-channel transistor 328 has a gate connected to the input of inverter 132 and to the output of inverter 130. The sources of transistors 326 and 328 are connected to a power conductor that receives a ground potential $V_{SS}$. Note that the signals CLK and DATA may be referred to as WRITE_WORD_LINE and WRITE_BIT_LINE, respectively.

Figure 4:
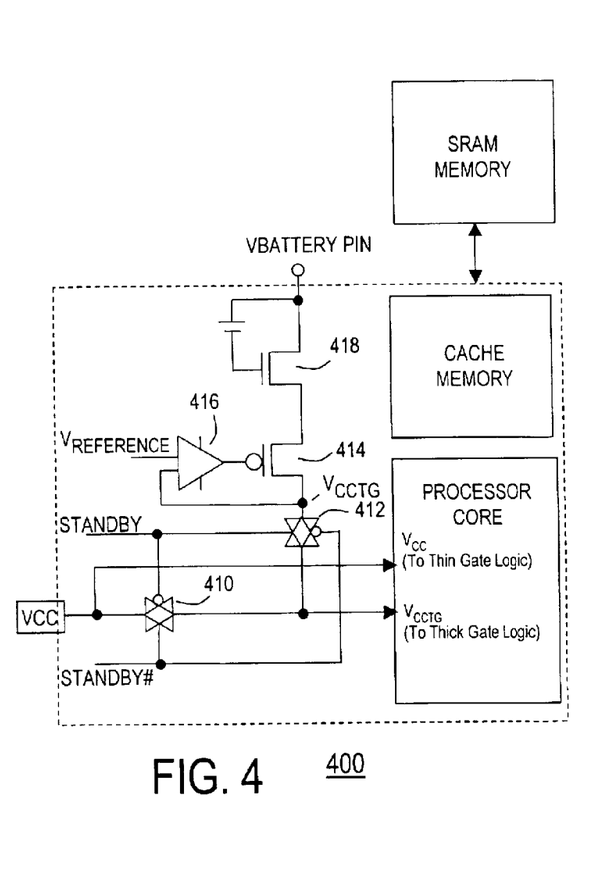
FIG. 4 is a schematic of circuitry that provides a power supply scheme for the register file cell shown in FIG. 3.

FIG. 4 is a schematic that provides a power supply scheme for register file cell 300 that is integrated with a processor core and a memory in a communications system. A power pin $V_{CC}$ receives a voltage potential from an off-chip regulator that is supplied as an operating voltage potential to inverters 130 and 132 and to P-channel transistors 318 and 320 (see FIG. 3). In normal operation (STANDBY is a zero logic value) transmission gate 410 is conducting, so that the voltage potential $V_{CC}$ supplied to the thin gate logic is substantially equivalent to the voltage potential $V_{CCTG}$ supplied to the thick gate logic in area 134 (see FIG. 3). With the voltage potentials $V_{CC}$ and $V_{CCTG}$ equivalent to one another, the P-channel transistors in N-well regions may be appropriately biased.

When operating in standby or low power mode, transmission gate 410 is off and transmission gate 412 is on to provide the voltage potential $V_{CCTG}$ through transistors 414 and 418 from the VBATTERY PIN. An amplifier 416 compares the voltage potential $V_{CCTG}$ at the source of transistor 414 against a reference value $V_{REFERENCE}$ to control the conductivity of transistor 414 and adjust the voltage $V_{CCTG}$ to $V_{REFERENCE}$. It should be pointed out that other regulation schemes may be used such as, for example, amplifier 416 and transistors 414 and 418 may be comprised of a switching or switched capacitor regulator which may be more efficient under some conditions. The voltage potential $V_{CCTG}$ is a linearly regulated voltage derived directly from a battery voltage potential, or alternatively, from an off-die high voltage supply. Note that the voltage potential $V_{CC}$ supplied to the power pin may be driven to zero volts, and thereby, eliminate any leakage contribution from logic on that power conductor. Alternatively, the voltage potential $V_{CC}$ may be floated to allow leakage to discharge the supply.

Figure 5:
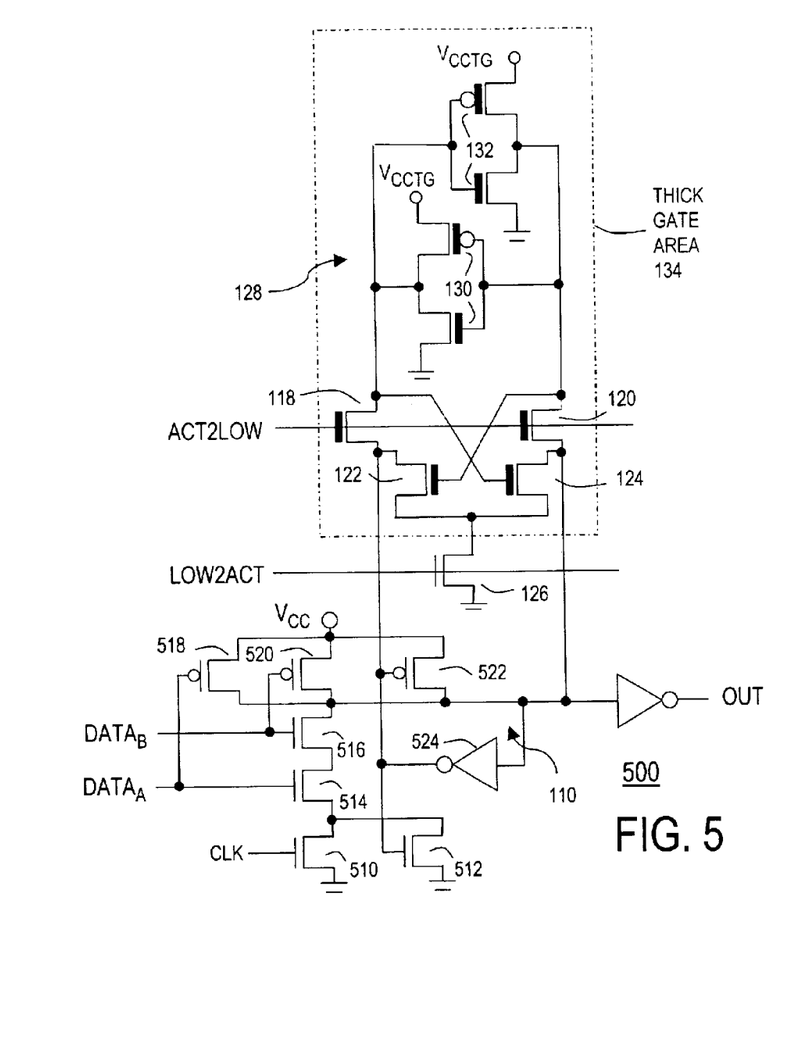
FIG. 5 is a schematic for a set dominant latch having a state retentive memory in accordance with the present invention.

FIG. 5 is a schematic for a Set Dominant Latch (SDL) 500 having a state retentive memory in accordance with the present invention. The SDL is useful as a dynamic-to-static logic converter and since a logic state may be stored at dynamic nodes, the SDL may be used to properly restore the state to the thin gate logic. SDL 500 receives input signals $DATA_A$ and $DATA_B$ at respective inputs of transistors 514 and 516. The NAND function value of the input signals $DATA_A$, $DATA_B$ is resolved and available when the clock signal CLK is asserted. Note that one of transistors 514 or 516 may be optional so that SDL may be inverting rather than performing the Nand function. When entering a low power mode, the signal ACT2LOW may be asserted and the NAND function value may be transferred to latch 128. With the NAND function value stored in latch 128, the signal ACT2LOW may be deasserted and the operating voltage potential $V_{CC}$ that powers the NAND function logic and other logic in the high performance section may be switched to zero. The voltage potential of $V_{CCTG}$ is maintained high during the low power mode to keep inverters 130 and 132 powered. With the operating voltage potential $V_{CC}$ switched to zero, the gate leakage current of the thin gate-oxide transistors in the high performance section is negligible, thus providing lower power in a standby mode of operation.

To leave the low power mode and return to an active operating mode, the signal LOW2ACT is asserted, followed by the operating voltage potential $V_{CC}$ being ramped to activate latch 110. The state value retained in latch 128 is written by transistors 122, 124 and 126 back to inverter 524 and transistors 512 and 522 while powering up the high performance section. The signal LOW2ACT may then be deasserted when the operating voltage potential $V_{CC}$ becomes stable.

Figure 6:
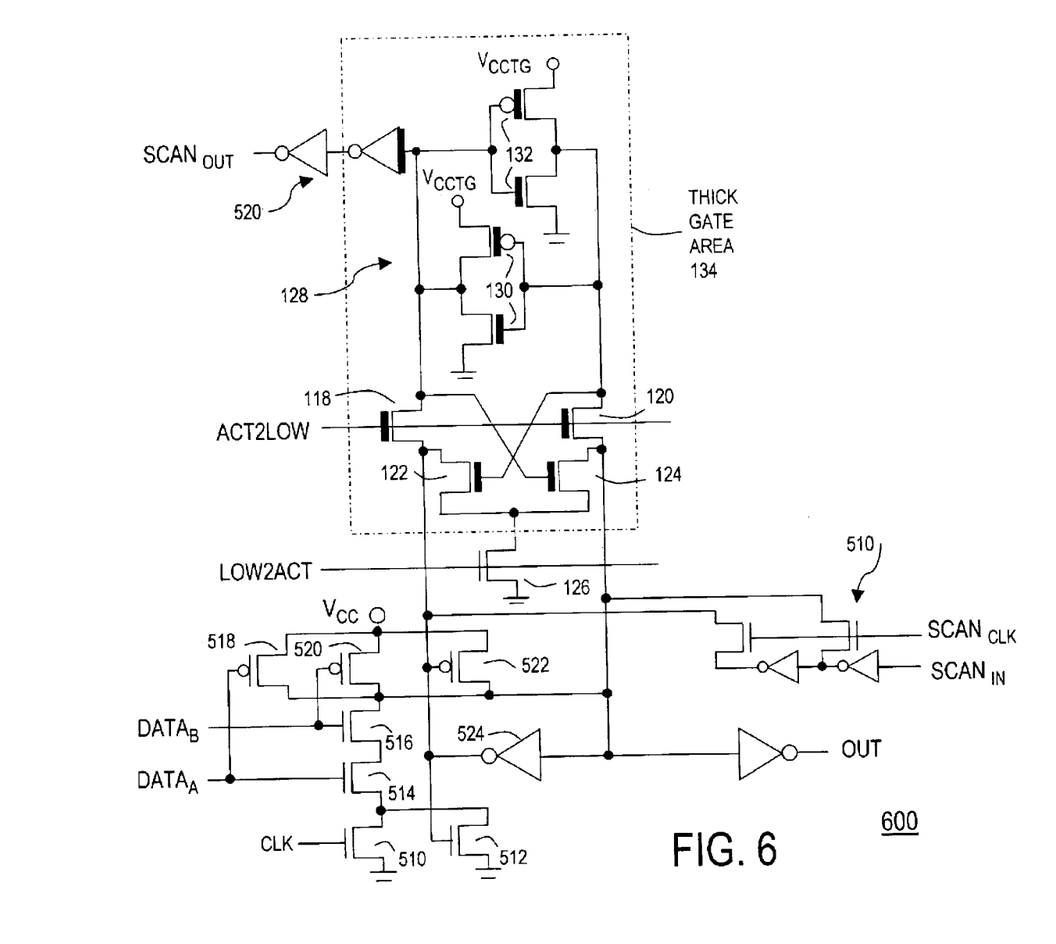
FIG. 6 is a schematic for a set dominant latch having scan and a state retentive memory in accordance with the present invention.
Figure 7:
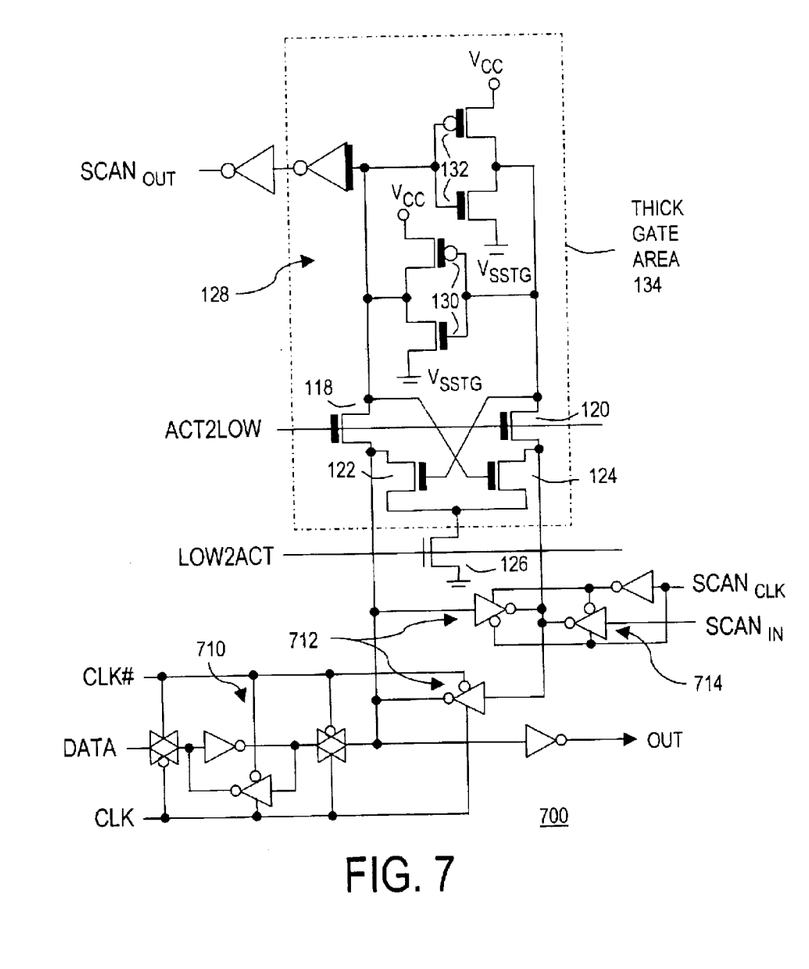
FIG. 7 is a schematic for a master/slave latch circuit with scan and having a state retentive memory in accordance with the present invention.

FIG. 6 is a schematic for a Set Dominant Latch (SDL) 600 having scan logic 510, 520 and a state retentive memory in accordance with the present invention. Comparing FIGS. 5 and 6, additional gates have been added that allow $SCAN_{IN}$ data to be written into SDL 600 and the state value $SCAN_{OUT}$ to be passed on to another cell. Thus, scan logic 510 shows $SCAN_{IN}$ data received in a scan mode and clocked by $SCAN_{CKL}$ for latching, with data transferred through N-channel pass transistors 118 and 120 as controlled by the signal ACT2LOW for storage by inverters 130 and 132 in latch 128. Scan logic 520 shows the state value $SCAN_{OUT}$ stored in latch 128 at an output of SDL 600. FIG. 7 is a schematic for a master/slave latch circuit 700 having scan and a state retentive memory in accordance with the present invention. In this embodiment the data is clocked by a signal CLK into a master portion 710 of the latch and transferred to a slave portion 712 when the signal CLK is deasserted. Alternatively, $SCAN_{IN}$ data may be received by scan logic 714 in a scan mode and clocked by $SCAN_{CLK}$ for latching in slave portion 712. Data stored in slave portion 712 may be transferred through N-channel pass transistors 118 and 120 as controlled by the signal ACT2LOW for storage by inverters 130 and 132 in latch 128. The signal ACT2LOW may be deasserted and the operating voltage potential $V_{CC}$ that powers the master/slave and other logic in the high performance section may be switched to zero. The voltage potential of $V_{CCTG}$ is maintained high during the low power mode to keep inverters 130 and 132 powered. With the operating voltage potential $V_{CC}$ switched to zero, the gate leakage current of the thin gate-oxide transistors in the high performance section is negligible, thus providing lower power in a standby mode of operation.

To leave the low power mode and return to an active operating mode, the signal LOW2ACT is asserted, followed by the operating voltage potential $V_{CC}$ being ramped to activate the master/slave. The data value retained in latch 128 is written by transistors 122, 124 and 126 back to slave portion 714 while powering up the high performance section. The signal LOW2ACT may then be deasserted when the operating voltage potential $V_{CC}$ becomes stable. It is assumed that the master is open, i.e., the clock signal CLK is high, when powering up.

Figure 8:
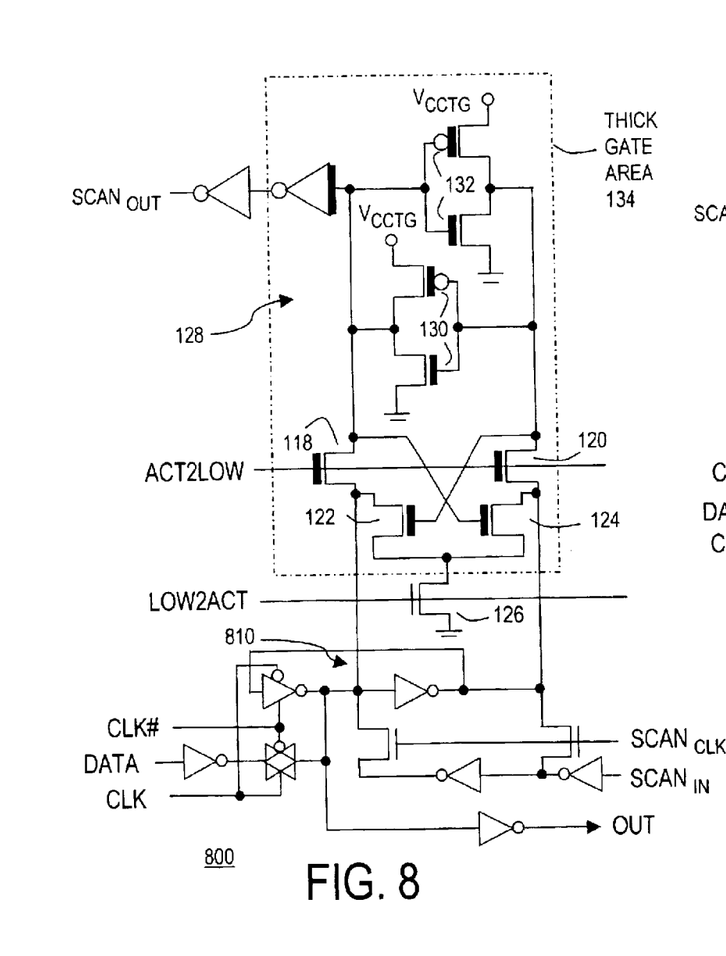
FIG. 8 is a schematic for a latch with scan and having a state retentive memory in accordance with the present invention.

FIG. 8 is a schematic for a latch circuit 800 with scan and having a state retentive memory in accordance with the present invention. In this embodiment the data is clocked by a signal CLK into a latch 810. Alternatively, $SCAN_{IN}$ data may be received in a scan mode and clocked by $SCAN_{CLK}$ for writing scan data into latch 810. In this mode the thick gate latch is used as the scan slave latch. Data stored in latch 810 may be transferred through N-channel pass transistors 118 and 120 as controlled by the signal ACT2LOW for storage by inverters 130 and 132 in latch 128. The signal ACT2LOW may be deasserted and the operating voltage potential $V_{CC}$ that powers the latch 810 and other logic in the high performance section may be switched to zero. The voltage potential of $V_{CCTG}$ is maintained high during the low power mode to keep inverters 130 and 132 powered. With the operating voltage potential of the high performance section switched to zero, the gate leakage current of the thin gate-oxide transistors in that section is negligible, thus providing lower power in a standby mode of operation.

To leave the low power mode and return to an active operating mode, the signal LOW2ACT is asserted, followed by the operating voltage potential of the high performance section being ramped to activate the latch 810. The data value retained in latch 128 is written by transistors 122, 124 and 126 back to latch 810 while powering up the high performance section. The signal LOW2ACT may then be deasserted when the operating voltage potential of the high performance section becomes stable.

Figure 9:
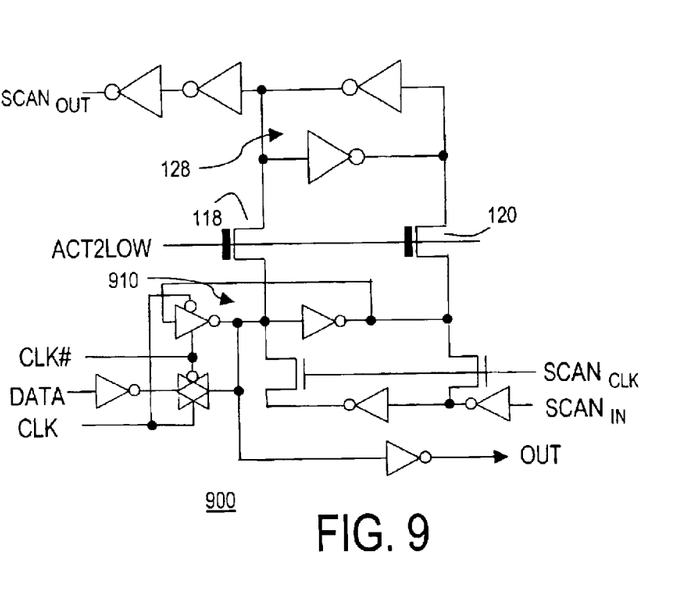
FIG. 9 is a schematic for a latch with thin-gate retain and scan in accordance with the present invention.

FIG. 9 is a schematic for a latch 900 with scan and thin-gate scan slave latch in accordance with the present invention. The transistors in this embodiment that are used both in the high performance section and the state retentive memory may be processed to have a thin gate-oxide thickness. In this embodiment the data is either clocked by a signal CLK, or alternatively, clocked by a signal $SCAN_{CLK}$ in a scan mode and for writing data into a latch 910. Data stored in latch 910 may be transferred through N-channel pass transistors 118 and 120 as controlled by the signal ACT2LOW for storage by inverters 130 and 132 in latch 128. The signal ACT2LOW may be deasserted and the operating voltage potential $V_{CC}$ that powers the latch 910 and other logic in the high performance section may be switched to zero. The voltage potential for inverters 136 and 132 is not maintained high during the low power mode. This circuit demonstrates that a compatible non-state retentive scan scheme may be utilized for logic that does not require state retention.

By now it should be clear that embodiments have been presented that improve system performance and reduce power when a state retentive memory structure is used to store state values. A high performance section that has thin gate-oxide transistors receives data that may be captured and retained in a memory device by thick gate-oxide transistors. With the leakage current of thick gate-oxide transistors being significantly less than the leakage current of thin gate-oxide transistors, the state retention circuitry that incorporates the thick gate-oxide transistors provides a reduced leakage current and a lower power in a standby mode of operation.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A state retentive circuit comprising:
   first and second latches;
   first and second pass transistors coupled between the first and second latches to transfer data received by the first latch to the second latch; and
   first and second transistors having gates coupled respectively to an input and output of the second latch, where first conduction terminals of the first and second transistors are coupled to an input and an output of the first latch to write the data stored in the second latch to the first latch.

2. The state retentive circuit of claim 1, wherein the first latch includes first and second inverters having different gate-oxide thicknesses from first and second inverters in the second latch.

3. The state retentive circuit of claim 2, wherein the first and second inverters in the first latch have a first gate-oxide thickness and a first threshold voltage that are less than a second gate-oxide thickness and a second threshold voltage of the first and second inverters in the second latch.

4. The state retentive circuit of claim 2, wherein the first and second transistors have a gate-oxide thickness that is substantially the same as the gate-oxide thickness of the first and second inverters in the second latch.

5. The state retentive circuit of claim 1, further including a third transistor having a gate coupled to receive a signal, wherein commonly connected second conduction terminals of the first and second transistors are coupled to ground through the third transistor.

6. The state retentive circuit of claim 1, further including a third transistor having a gate coupled to a second conduction terminal of the first transistor, wherein a second conduction terminal of the second transistor is coupled to ground through the third transistor.

7. The state retentive circuit of claim 1, further including an inverter coupled to receive scan data to overwrite the first latch with the scan data.

8. A state retentive circuit comprising:
   a first latch with first and second inverters;
   a second latch with first and second inverters having a gate-oxide thickness that is greater than a gate-oxide thickness of the first and second inverters in the first latch; and
   first and second pass transistors having commonly connected gates to receive a control signal and pass a signal stored in the first latch to the second latch but not from the second latch to the first latch.

9. The state retentive circuit of claim 8 further comprising:
   a first transistor having a gate coupled to an input of the first inverter and an output of the second inverter in the second latch; and
   a second transistor having a gate coupled to an output of the first inverter and an input of the second inverter in the second latch, where the first and second transistors write data stored in the second latch to the first latch.

10. The state retentive circuit of claim 9 wherein a gate-oxide thickness of the first and second transistors is greater than a gate-oxide thickness of the first and second inverters in the first latch.

11. The state retentive circuit of claim 8, further comprising:
    an inverter coupled to receive scan data to overwrite the first latch with the scan data.

12. A communication system comprising:
    an external SRAM memory;
    a processor coupled via a bus to the SRAM memory, wherein the processor includes,
      a first circuit to generate a first data value and a complemented data value;
      first and second pass transistors having commonly connected gates to receive a signal;
      cross-coupled inverters coupled to the first and second pass transistors to receive the data value and the complemented data value and provide a stored data value and a stored complemented data value; and
      first and second transistors having gates coupled to the cross-coupled inverters to write the stored data value and the stored complemented data value from the cross-coupled inverters to the first circuit.

13. The communication system of claim 12, wherein the first circuit is a master/slave latch and the slave supplies the data value and the complemented data value.

14. The communication system of claim 12, wherein the first circuit is a Set Dominant Latch (SDL).

15. The communication system of claim 12, wherein the first circuit generates a first data value and a complemented data value from a scanned signal.

16. A method, comprising:
generating a first data value and a complemented data value in a first circuit;
transferring the first data value and the complemented data value from the first circuit to a second circuit while a first signal is asserted;
removing power from the first circuit after the first signal is deasserted;
writing the first data value and the complemented data value stored in the second circuit to the first circuit while a second signal is asserted; and
restoring power to the first circuit.

17. The method of claim 16, further comprising:
using transistors in the first circuit having a first gate-oxide thickness; and using transistors in the second circuit having a second gate-oxide thickness that is greater than the first gate-oxide thickness.

18. The method of claim 16, further comprising:
asserting the first signal to indicate a low power operating mode and the second signal to indicate an active operating mode.

19. The method of claim 16, further comprising:
writing data into a master portion of a latch in the first circuit and generating the first data value and the complemented data value in a slave portion of the latch.

20. The method of claim 19, further comprising:
stopping a clock in any clock phase after writing the data into the master portion of the latch.

21. A method comprising:
providing first and second power conductors to a processor core, where the first power conductor is coupled to thin gate-oxide logic and the second power conductor is coupled to thick gate-oxide logic;
supplying a first voltage potential from a first terminal of the processor core to the first and second power conductors in a first mode; and
supplying a second voltage potential from a second terminal of the processor core to a circuit that includes a reference voltage that is compared to the second voltage potential to provide a regulated voltage potential to the second power conductor in a second mode.

22. The method of claim 21, further comprising:
using a linear regulator in the circuit to generate the regulated voltage potential.

23. The method of claim 21, further comprising:
using a switched capacitor linear regulator in the circuit to generate the regulated voltage potential.

24. The method of claim 21, further comprising:
discontinuing the supply of the first voltage potential from the first terminal of the processor core; and
continuing to supply the second voltage potential to the circuit to provide the regulated voltage potential to the second power conductor in the second mode.

25. A state retentive latch comprising:
a first N-channel transistor;
a first P-channel transistor having a gate coupled to a gate of the first N-channel transistor to receive a first data signal, a source coupled to a first power conductor and a drain coupled to a drain of the first N-channel transistor;
an enabling transistor having a gate to receive a clock signal, a source coupled to a second power conductor and a drain coupled to a source of the first N-channel transistor;
a second N-channel transistor having a drain coupled to the drain of the enabling transistor and a source coupled to the second power conductor; and
a feedback inverter having an input coupled to the drain of the first P-channel transistor and an output coupled to a gate of the second N-channel transistor.

26. The state retentive latch of claim 25 further comprising:
a third N-channel transistor having current conducting terminals coupled between the source of the first N-channel transistor and the drain of the enabling transistor and a gate to receive a second data signal.

27. The state retentive latch of claim 26 further comprising:
a second P-channel transistor having a source coupled to the first power conductor, a drain coupled to the drain of the first P-channel transistor and a gate to receive the second data signal.

28. The state retentive latch of claim 25 further comprising:
a third P-channel transistor having a source coupled to the first power conductor, a drain coupled to the drain of the first P-channel transistor and a gate coupled to the gate of the second N-channel transistor.

29. The state retentive latch of claim 25 further comprising:
a latch; and
a first pass transistor to couple an output of the feedback inverter to an input of the latch and a second pass transistor to couple an input of the feedback inverter to an output of the latch, where gates of the first and second pass transistors are commonly connected.

30. The state retentive latch of claim 29 wherein the first and second pass transistors and the latch have thick gate oxides.

31. A state retentive circuit comprising:
a latch;
a transfer device to receive data and pass the data to a node;
first and second pass transistors having commonly connected gates to receive a control signal, where the first pass transistor passes the data on the node to an input of the latch; and
first and second transistors having drains commonly coupled to receive a first voltage potential, where a gate of the first transistor is coupled to the input of the latch and a gate of the second transistor is coupled to an output of the latch and a source of the second transistor is coupled to the node.

32. The state retentive circuit of claim 31 further comprising:
a third transistor having a gate coupled to a source of the first transistor, a drain coupled to the node and a source coupled to a second voltage potential.

33. The state retentive circuit of claim 31 wherein a source of the first transistor is coupled to a source of the first pass transistor.

34. The state retentive circuit of claim 31 wherein the first and second pass transistors and the first and second transistors have gate oxides that are greater than a gate oxide of the transfer device.

35. A state retentive circuit comprising:
a latch;
first and second pass transistors having commonly connected gates to receive a control signal, where the first pass transistor passes data on a first node to an input of the latch and the second pass transistor passes data on a second node to an output of the latch;

a first transistor having a gate to receive a clock signal and a drain coupled to the first node; and serially connected second and third transistors to couple the second node to ground, where a gate of the second transistor is coupled to the gate of the first transistor and a gate of the third transistor is coupled to a source of the first transistor.

36. The state retentive circuit of claim 35 further comprising:

fourth and fifth transistors having sources commonly coupled to ground, where a gate of the fifth transistor is coupled to the input of the latch, a gate of the fourth transistor is coupled to an output of the latch, a drain of the fourth transistor is coupled to the first node and a drain of the fifth transistor is coupled to the second node.

37. The state retentive circuit of claim 35 further comprising:

first and second P-channel transistors having sources commonly coupled to a power conductor; where a drain of the first P-channel transistor and a gate of the second P-channel transistor are coupled to the first node and a drain of the second P-channel transistor and a gate of the first P-channel transistor are coupled to the second node.

38. A circuit comprising:

a latch with first and second inverters having thick gate oxides;

first and second pass transistors having commonly connected gates to receive a control signal to pass data stored on first and second nodes to the latch;

a transfer transistor to receive input data to clock onto the first node and complemented input data onto the second node; and first and second scan pass transistors having commonly connected gates to receive a scan clock signal to clock scan data onto the first node and complemented scan data onto the second node.

39. The circuit of claim 38 further including first and second transistors having sources commonly coupled to a power conductor, where a gate of the first transistor is connected to an input of the latch, a gate of the second transistor is connected to an output of the latch, a drain of the first transistor is coupled to the second node and a drain of the second transistor is coupled to the first node.

40. The circuit of claim 38 further including:

a third transistor coupled between the sources of the first and second transistors and the power conductor, and having a gate to receive a signal.

* * * * *

UNITED STATES PATENT AND TRADEMARK OFFICE
CERTIFICATE OF CORRECTION

PATENT NO. : 6,775,180 B2
DATED : August 10, 2004
INVENTOR(S) : Biyani et al.

It is certified that error appears in the above-identified patent and that said Letters Patent is hereby corrected as shown below:

Column 7,
Line 22, delete "136" and insert -- 130 --.

Signed and Sealed this

Twenty-first Day of December, 2004

JON W. DUDAS
*Director of the United States Patent and Trademark Office*